United States Patent
Scharf et al.

(10) Patent No.: US 10,964,628 B2
(45) Date of Patent: Mar. 30, 2021

(54) CLIP FRAME ASSEMBLY, SEMICONDUCTOR PACKAGE HAVING A LEAD FRAME AND A CLIP FRAME, AND METHOD OF MANUFACTURE

(71) Applicant: Infineon Technologies AG, Neubiberg (DE)

(72) Inventors: Thorsten Scharf, Regensburg (DE); Martin Gruber, Schwandorf (DE); Josef Hoeglauer, Heimstetten (DE); Michael Juerss, Regensburg (DE); Josef Maerz, Oberhaching (DE); Thorsten Meyer, Regensburg (DE); Bun Kian Tay, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 119 days.

(21) Appl. No.: 16/282,207

(22) Filed: Feb. 21, 2019

(65) Prior Publication Data
US 2020/0273781 A1   Aug. 27, 2020

(51) Int. Cl.
*H01L 23/495*   (2006.01)
*H01L 21/56*   (2006.01)
*H01L 23/31*   (2006.01)

(52) U.S. Cl.
CPC ...... *H01L 23/49524* (2013.01); *H01L 21/565* (2013.01); *H01L 23/3107* (2013.01); *H01L 23/49503* (2013.01); *H01L 23/49537* (2013.01); *H01L 23/49555* (2013.01); *H01L 23/49562* (2013.01)

(58) Field of Classification Search
CPC ............. H01L 23/49524; H01L 21/565; H01L 23/3107; H01L 23/49503; H01L 23/49537; H01L 23/49555; H01L 23/49562
See application file for complete search history.

(56) References Cited

U.S. PATENT DOCUMENTS 5,110,761 A * 5/1992 Kalfus .............. H01L 23/49562
228/123.1
6,147,410 A   11/2000 Elliott et al.
(Continued)

FOREIGN PATENT DOCUMENTS

DE   102014104378 A1   10/2014
DE   102014104272 A1   10/2015
(Continued)

*Primary Examiner* — Peter Bradford
(74) *Attorney, Agent, or Firm* — Murphy, Bilak & Homiller, PLLC (57) ABSTRACT

A molded semiconductor package includes a lead frame having one or more first leads monolithically formed with a die pad and extending outward from the pad in a first direction. A semiconductor die is attached to the die pad at a first side of the die. A metal clip of a clip frame is attached to a power terminal at a second side of the die. One or more second leads monolithically formed with the metal clip extend outward from the clip in a second direction different than the first direction. A mold compound embeds the die. The first lead(s) and the second lead(s) are exposed at different sides of the mold compound and do not vertically overlap with one another. Within the mold compound, the clip transitions from a first level above the power terminal to a second level in a same plane as the leads.

12 Claims, 8 Drawing Sheets

(56) References Cited

U.S. PATENT DOCUMENTS

| | | | |
|---|---|---|---|
| 8,288,200 B2 | 10/2012 | Xiaochun | |
| 9,054,091 B2 | 6/2015 | Yilmaz et al. | |
| 9,496,208 B1 | 11/2016 | Ostrowicki | |
| D803,801 S * | 11/2017 | Takeshita | D13/182 |
| 2008/0023807 A1 * | 1/2008 | Noquil | H01L 23/49575 |
| | | | 257/675 |
| 2011/0121461 A1 * | 5/2011 | Lim | H01L 24/97 |
| | | | 257/773 |
| 2013/0017649 A1 | 1/2013 | Touzet et al. | |
| 2015/0145110 A1 * | 5/2015 | Luan | H01L 21/561 |
| | | | 257/666 |
| 2017/0047274 A1 | 2/2017 | Shibuya | |
| 2017/0309554 A1 | 10/2017 | Mangrum et al. | |

FOREIGN PATENT DOCUMENTS

| | | |
|---|---|---|
| EP | 2802064 B1 | 11/2016 |
| KR | 101643332 B1 | 7/2016 |
| KR | 101652423 B1 | 8/2016 |

* cited by examiner

CLIP FRAME ASSEMBLY, SEMICONDUCTOR PACKAGE HAVING A LEAD FRAME AND A CLIP FRAME, AND METHOD OF MANUFACTURE

BACKGROUND

Power semiconductor packages include a power semiconductor die embedded in a mold compound. Electrical connections within the mold compound are formed between terminals of the power semiconductor die and leads of the package. The leads are part of a lead frame to which the power semiconductor die is attached. Some types of power semiconductor packages use a metal clip to connect the source terminal at the top side of the power semiconductor die to a lead post of the lead frame. The clip assembly typically includes two parts: the metal clip itself and the lead post. Both parts are typically soldered together, which requires a landing zone for attaching the clip on the lead frame. The clip landing zone consumes space on the lead frame, since attachment of the clip to the lead frame is done by soldering, diffusion soldering or a similar process. The contact area required for the clip cannot be used for additional die area in the package. Also, the clip attachment process is done in a serial manner and therefore is slow and costly. Furthermore, the gate terminal of the power semiconductor is typically contacted by a bond wire which requires an additional process step with extra equipment investment and has different requirements regarding surfaces on the die and the lead frame.

Thus, there is a need for an improved contact structure for power semiconductor packages.

SUMMARY

According to an embodiment of a method of manufacturing a molded semiconductor package, the method comprises: providing a lead frame comprising a die pad and one or more first leads monolithically formed with the die pad and extending outward from the die pad in a first direction, the die pad and the one or more first leads being attached to a periphery of the lead frame; attaching a first side of a semiconductor die to the die pad; aligning a clip frame with the lead frame so that a first pre-bent metal clip of the clip frame is vertically aligned with a power terminal at a second side of the semiconductor die opposite the first side, the clip frame further comprising one or more second leads monolithically formed with the first pre-bent metal clip and extending outward from the first pre-bent metal clip in a second direction different than the first direction and attached to a periphery of the clip frame; attaching the first pre-bent metal clip to the power terminal at the second side of the semiconductor die; embedding the semiconductor die in a mold compound so that the one or more first leads and the one or more second protrude from the mold compound in generally planar directions and do not vertically overlap with one another; and separating the one or more first leads from the periphery of the lead frame and the one or more second leads from the periphery of the clip frame outside the mold compound.

Separating the one or more first leads from the periphery of the lead frame and the one or more second leads from the periphery of the clip frame outside the mold compound may comprise stamping the one or more first leads and the one or more second leads outside the mold compound, or cutting the one or more first leads and the one or more second leads outside the mold compound.

Separately or in combination, the method may further comprise: attaching a second pre-bent metal clip of the clip frame to a control terminal at the second side of the semiconductor die, wherein the clip frame further comprises a third lead extending outward from the second pre-bent metal clip and attached to the periphery of the clip frame, wherein after embedding the semiconductor die in the mold compound, the third lead protrudes from the mold and does not vertically overlap with the one or more first leads.

Separately or in combination, the method may further comprise: separating the third lead from the periphery of the clip frame outside the mold compound via a same stamping process used to separate the one or more first leads from the periphery of the lead frame and the one or more second leads from the periphery of the clip frame.

Separately or in combination, the one or more first leads may protrude from a first side face of the mold compound after separation from the periphery of the lead frame and the one or more second leads may protrude from a second side face of the mold compound different than the first side face after separation from the periphery of the clip frame.

Separately or in combination, the method may further comprise: plating the part of the one or more first leads which protrudes from the first side face of the mold compound and the part of the one or more second leads which protrudes from the second side face of the mold compound, to form wettable lead surfaces at different side faces of the mold compound.

Separately or in combination, the lead frame may be unbent.

Separately or in combination, the clip frame may comprise alignment features to aid in the aligning of the clip frame with the lead frame.

Separately or in combination, the clip frame may be stacked on top of the lead frame in an area of a mold runner used during the embedding of the semiconductor die in the mold compound.

Separately or in combination, the method may further comprise: pressing the clip frame against the lead frame to provide tight sealing during the embedding of the semiconductor die in the mold compound.

According to an embodiment of a molded semiconductor package, the molded semiconductor package may comprise: a lead frame comprising a die pad and one or more first leads monolithically formed with the die pad and extending outward from the die pad in a first direction; a semiconductor die attached to the die pad at a first side of the semiconductor die; a clip frame comprising a first metal clip attached to a power terminal at a second side of the semiconductor die opposite the first side, and one or more second leads monolithically formed with the first metal clip and extending outward from the first metal clip in a second direction different than the first direction; and a mold compound embedding the semiconductor die, wherein the one or more first leads and the one or more second leads are exposed at different sides of the mold compound and do not vertically overlap with one another, wherein within the mold compound, the first metal clip transitions from a first level above the power terminal at the second side of the semiconductor die to a second level in a same plane as the one or more first leads and the one or more second leads.

The clip frame may further comprise a second metal clip attached to a control terminal at the second side of the semiconductor die and a third lead extending outward from the second metal clip, and the third lead may be exposed at a side of the mold compound and may not vertically overlap with the one or more first leads.

Separately or in combination, the one or more first leads may protrude from a first side face of the mold compound and the one or more second leads may protrude from a second side face of the mold compound different than the first side face.

Separately or in combination, the part of the one or more first leads which protrudes from the first side face of the mold compound and the part of the one or more second leads which protrudes from the second side face of the mold compound may be at least partially plated to form wettable lead surfaces at different side faces of the mold compound.

Separately or in combination, the first metal clip maybe bent in at least two different places within the mold compound.

Separately or in combination, the semiconductor die may be a power transistor die, a power terminal at the first side of the power semiconductor die may be a drain or collector terminal, the power terminal at the second side of the power semiconductor die may be a source or emitter terminal, and the power semiconductor die maybe attached to the die pad in a drain-down or collector-down configuration.

Separately or in combination, the semiconductor die may be a power transistor die, a power terminal at the first side of the power semiconductor die may be a source or emitter terminal, the power terminal at the second side of the power semiconductor die may be a drain or collector terminal, and the power semiconductor die may be attached to the die pad in a source-down or emitter-down configuration.

Separately or in combination, the lead frame may comprise an additional lead attached to a control terminal at the first side of the power semiconductor die and the additional lead may be exposed at the same side of the mold compound as the one or more first leads.

According to an embodiment of a method of manufacturing molded semiconductor packages, the method comprises: providing a lead frame panel which includes a plurality of unit lead frames connected to one another, each unit lead frame comprising a die pad and one or more first leads monolithically formed with the die pad and extending outward from the die pad in a first direction, the die pad and the one or more first leads being attached to a periphery of the unit lead frame; attaching a separate semiconductor die at a first side to each of the die pads, each semiconductor die comprising a power terminal at a second side opposite the first side; aligning a clip frame panel with the lead frame panel, the clip frame panel including a plurality of unit clip frames connected to one another, each unit clip frame comprising a first pre-bent metal clip vertically aligned with a corresponding power terminal at the second side of one of the semiconductor dies, and one or more second leads monolithically formed with the first pre-bent metal clip and extending outward from the first pre-bent metal clip in a second direction different than the first direction and attached to a periphery of the unit clip frame; attaching each first pre-bent metal clip to the power terminal at the second side of the corresponding semiconductor die; embedding the semiconductor dies in a mold compound so that each one or more first leads and each one or more second leads protrude from the mold compound in generally planar directions and do not vertically overlap with one another; and separating each one or more first leads from the periphery of the corresponding unit lead frame and each one or more second leads from the periphery of the corresponding unit clip frame outside the mold compound.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A shows the semiconductor package after molding, but prior to singulation. FIG. 1B shows the semiconductor package after die attach, but prior to clip frame placement. FIG. 1C shows the semiconductor package after clip frame placement, but prior to molding.

DETAILED DESCRIPTION

The embodiments described herein provide a molded semiconductor package that includes a lead frame to which a semiconductor die is attached and a separate clip frame for contacting one or more terminals at the top side of the semiconductor die. Each clip used to contact a terminal at the top side of the semiconductor die is disposed in a frame separate from the lead frame to which the semiconductor die is attached. Hence, the lead frame contains the leads and contacts for some but not all of the die terminals. The separate clip frame provides the leads and contacts for the remaining die terminal(s).

Figure 1A:
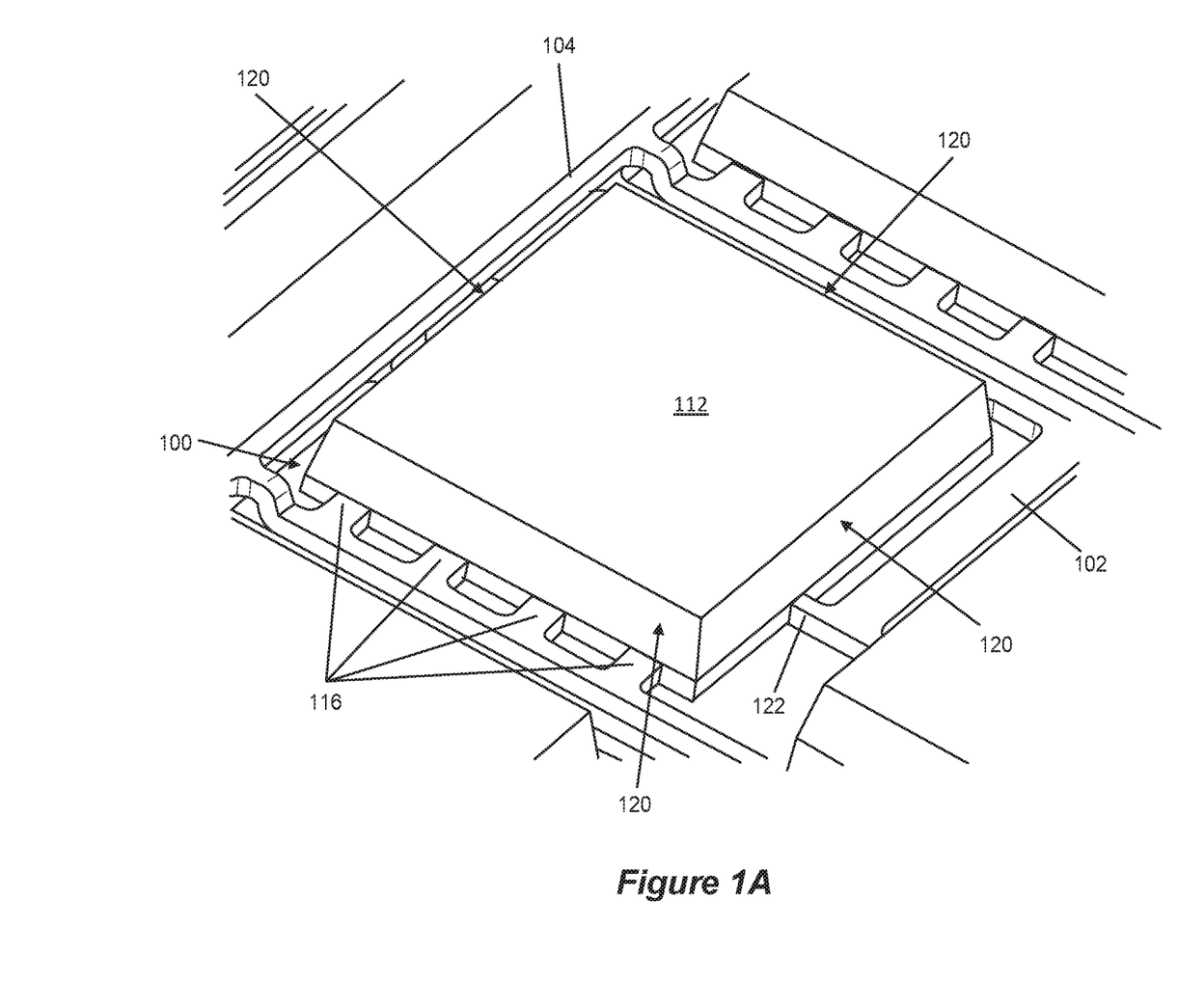
FIGS. 1A through 1C illustrate an embodiment of a molded semiconductor package having a lead frame to which a semiconductor die is attached and a separate clip frame for contacting one or more terminals at the top side of the semiconductor die.
Figure 1B:
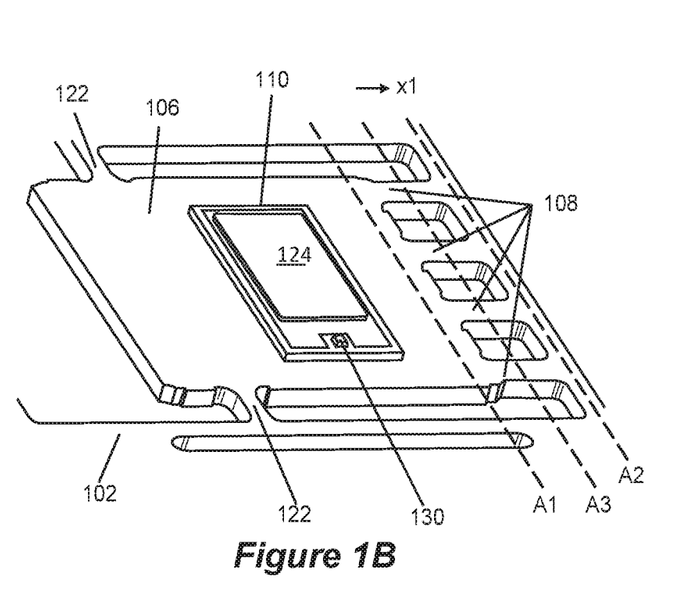
Figure 1C:
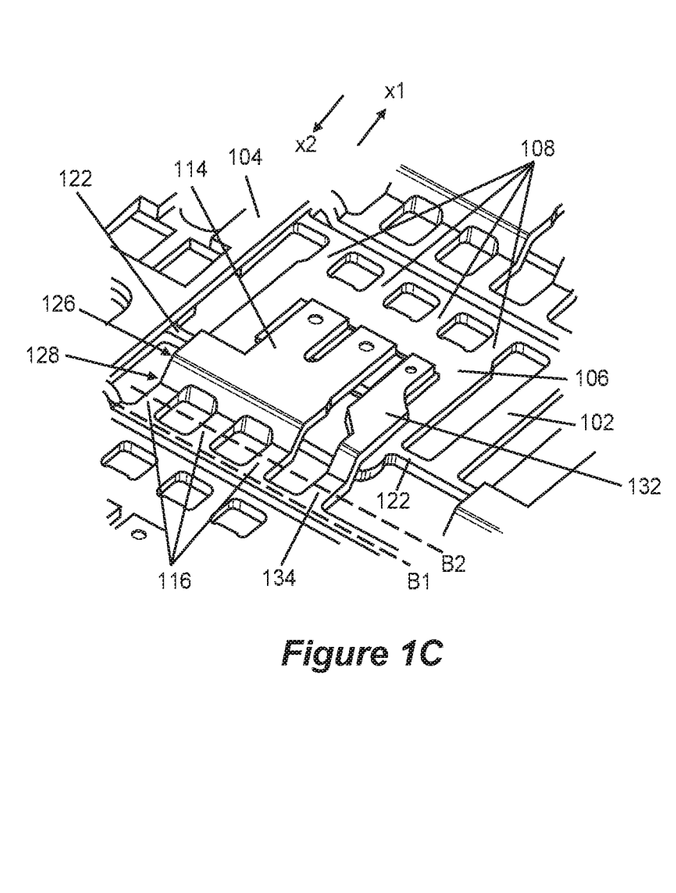

FIGS. 1A through 1O illustrate an embodiment of a molded semiconductor package 100 prior to singulation, i.e., physical separation from other molded semiconductor packages formed at the same time. FIG. 1A shows the semiconductor package 100 after molding, but prior to singulation. FIG. 1B shows the semiconductor package 100 after die attach, but prior to clip frame placement. FIG. 1C shows the semiconductor package 100 after clip frame placement, but prior to molding.

The molded semiconductor package 100 includes a lead frame 102 and a separate clip frame 104. The lead frame 102 includes a die pad 106 and one or more first leads 108 monolithically formed with the die pad 106 and extending outward from the die pad 106 in a first direction x1. That is, the die pad 106 and the one or more first leads 108 are formed or composed of the same material without joints and are at the same potential (e.g. power, ground, etc.). In some cases, only a single first lead 108 may be monolithically formed with the die pad 106 and extend outward from the die pad 106 in the first direction x1. For example, the lead frame 102 may be cut along the dashed line labelled A1 or along the dashed line labelled A2 in FIG. 1B. In other cases, more than one first lead 108 may be monolithically formed with the die pad 106 and extend outward from the die pad 106 in the first direction x1. For example, the lead frame 102 may be cut along the dashed line labelled A3 in FIG. 1B. Hence, the use of the term 'first lead(s)' herein to indicate that one or more first leads 108 may be monolithically formed with the die pad 106 and extend outward from the die pad 106 in a first direction x1.

In each case, the die pad 106 is the region of the lead frame 102 to which one or more semiconductor dies 110 are attached. At least one semiconductor die 110 is attached to the die pad 106 of the lead frame 102, and each semiconductor die 110 attached to the die pad 106 is embedded in a plastic mold compound 112 such as an epoxy mold compound.

The semiconductor die 110 attached to the lead frame 102 may be a vertical device in that the main current path is between the top and bottom sides of the die 110. In this case, a power terminal (out of view) of the semiconductor die 110 is attached to the die pad 106 of the lead frame 102. The semiconductor die 110 may instead be a lateral device in that the main current path is along the top side of the die 110. In this case, all power terminals of the semiconductor die 110 are disposed at the top side of the die 110 which faces away from the die pad 106 of the lead frame 102. More than one semiconductor die 110 may be attached to the lead frame 102 and/or the molded semiconductor package 100 may include more than one lead frame 102 with one or more semiconductor dies 110 attached to each lead frame 102.

The separate clip frame 104 of the molded semiconductor package 100 includes at least a first metal clip 114 and one or more second leads 116 monolithically formed with the first metal clip 114 and extending outward from the first metal clip 114 in a second direction x2 different than the first direction x1. In some cases, only a single second lead 116 may be monolithically formed with the first metal clip 114 and extend outward from the first metal clip 114 in the second direction x2. For example, the clip frame 104 may be cut along the dashed line labelled B1 in FIG. 1O. In other cases, more than one second lead 116 may be monolithically formed with the first metal clip 114 and extend outward from the first metal clip 114 in the second direction x2. For example, the clip frame 104 may be cut along the dashed line labelled B2 in FIG. 1O. Hence, the use of the term 'second lead(s)' herein to indicate that one or more second leads 116 may be monolithically formed with the first metal clip 114 of the clip frame 104 and extend outward from the first metal clip 114 in a second direction x2.

In each case, the different directions x1, x2 in which the first and second leads 108, 116 extend depends on the type of molded semiconductor package 100. For example, in the case of SSO8 (shrink small-outline package), TSOP (thin small-outline package), TSON (thin small outline nonleaded), TOLL (transistor outline-leadless), or other type of dual row flat package, the first lead(s) 108 of the lead frame 102 and the second lead(s) 116 of the clip frame 104 extend in opposite directions x1, x2 and are disposed at opposite sides of the molded semiconductor package 100. In the case of QFP (quad flat package), QFN (quad flat no-leads package), or other type of quad row flat package, the first lead(s) 108 of the lead frame 102 and the second lead(s) 116 of the clip frame 104 extend in different but not necessarily opposite directions x1, x2 and are disposed at different but not necessarily opposite sides of the molded semiconductor package 100. In the case of multiple first leads 108 and/or multiple second leads 118, all leads 108/116 of the same kind (e.g. power, ground, etc.) need not necessarily extend in the same direction. For example, in the case of a QFN package, one first lead 108 may be disposed on each side on the lead frame 102 and all the second leads 116 may be disposed on the clip frame 104, e.g., also on four sides. Even in this case, none of the first leads 108 of the lead frame 102 would vertically overlap with any of the second leads 116 of the clip frame 104.

The molded semiconductor package 100 illustrated in FIGS. 1A through 1O is shown as a dual row leadless flat package. In general, the molded semiconductor package embodiments described herein may be implemented in any type of dual row or quad row flat package. For some types of packages, part of each first lead 108 of the lead frame 102 and part of each second lead 116 of the clip frame 104 are not covered by the mold compound 112. The uncovered part of the leads 108, 116 may be flush, recessed, or protrude slightly from the mold compound 112. For other types of packages, the first lead(s) 108 of the lead frame 102 and the second lead(s) 116 of the clip frame 104 protrude outward from different but not necessarily opposite side faces 120 of the mold compound 112.

In each case, the first lead(s) 108 of the lead frame 102 and the second lead(s) 116 of the clip frame 104 are exposed at different side faces 120 of the mold compound 112 and do not vertically overlap with one another. FIG. 1A shows each first lead 108 of the lead frame 102 and each second lead 116 of the clip frame 106 exposed at different side faces 120 of the mold compound 120. FIG. 1O shows each first lead 108 of the lead frame 102 and each second lead 116 of the clip frame 104 not vertically overlapping with one another. One or more tie bars 122 may be provided to further stabilize the die pad 106 during the die attach and molding processes. The tie bars 122 are severed during the singulation process, as are each first lead 108 of the lead frame 102 and each second lead 116 of the clip frame 104, to physically separate the molded semiconductor package 100 from other molded semiconductor packages manufactured at the same time.

Within the mold compound 112, the metal clip 114 of the clip frame 104 transitions from a first level above a power terminal 124 at the top side of the semiconductor die 110 to a second level in the same plane as the first lead(s) 108 of the lead frame 102 and the second lead(s) 116 of the clip frame 104. That is, the metal clip 114 of the clip frame 104 may be pre-bent in a way such that the clip 114 can be attached, e.g. by soldering, to the power terminal 124 at the top side of the semiconductor die 110 and such that each clip frame lead 116 monolithically formed with the metal clip 114 and extending outward from the clip 114 may reach the same level as the first lead(s) 108 of the lead frame 102. In one embodiment, the metal clip 114 of the clip frame 104 is bent in at least two different places 126, 128 within the mold compound 112 to provide the transition from the first level to the second level. The lead frame 102 may be unbent, allowing for easy application of die attach material (out of view) such as solder paste, sinter paste, glue, etc. to the die pad 106 of the lead frame 102 using a printing process such as stencil or screen printing or a dispensing or jetting process, etc. Even if the lead frame 102 is unbent, the lead frame 102 may still include coined areas, dimples, grooves, etc.

By using a separate clip frame 104 to implement some of the package leads, the size of the die pad 106 to which the semiconductor die 110 is attached can be increased, e.g., by approximately 20% or more, since the metal clip 116 is not attached to a separate lead post of the lead frame 102. Instead, each lead 116 provided by the clip frame 104 is monolithically formed with the metal clip 116 and terminates at the same level as the first lead(s) 108 of the lead frame 102. Hence, no separate lead post is needed to accommodate the metal clip 116. By using the clip frame 104 described herein, the area allocated for contacting a conventional metal clip to a separate lead post may instead be used to accommodate a larger semiconductor die without increasing the overall size of the molded semiconductor package 100.

In one embodiment, the semiconductor die 110 is a vertical power transistor die such as a power MOSFET (metal-oxide-semiconductor field effect transistor) die, IGBT (insulated gate bipolar transistor) die, etc. and a power terminal (out of view) at the bottom side of the power semiconductor die 110 is a drain or collector terminal. According to this embodiment, the power terminal 124 at the top side of the power semiconductor die 110 is a source or emitter terminal and the power semiconductor die 110 is attached to the die pad 106 of the lead frame 102 in a drain-down configuration in the case of a MOSFET or in an collector-down configuration in the case of an IGBT. Further according to this embodiment, the control (gate) terminal 130 of the semiconductor die 110 is located at the top side of the die 110 with the source terminal 124. The clip frame 104 may further include an additional metal clip 132 attached to the control terminal 130 at the top side of the semiconductor die 110 and an additional lead 134 extending outward from the additional metal clip 132 and monolithically formed with the additional metal clip 132. The additional lead 134 of the clip frame 104 is exposed at a side of the mold compound 112 and does not vertically overlap with the first lead(s) 108 of the lead frame 102. The additional metal clip 132 of the clip frame 104 may transition from the first level above the power terminal 124 at the top side of the semiconductor die 110 to the second level in the same plane as the lead(s) 108 of the lead frame 102 and the lead(s) 116, 134 of the clip frame 104. FIG. 10 shows such the additional metal clip 132 provided as part of the clip frame 104.

By providing the additional metal clip 132 as part of the clip frame 104, a wire bond for contacting the control terminal 130 at the top side of the semiconductor die 110 is not required, since the clip frame 104 also provides the gate contact. However, a wire bond may be used for contacting the control terminal 130 at the top side of the semiconductor die 110 instead of the clip frame 104. In this case, the bond wire connection would extend from the control terminal 130 at the top side of the semiconductor die 110 to one an additional lead (not shown) of the lead frame 102 or to one additional lead (also not shown) of the clip frame 104.

In another embodiment, the semiconductor die 110 is a vertical power transistor die and the power terminal at the bottom side of the power semiconductor die 110 is a source or emitter terminal. According to this embodiment, the power terminal 124 at the top side of the power semiconductor die 110 is a drain or collector terminal and the die 110 is attached to the die pad 106 of the lead frame 120 in a source-down configuration in the case of a MOSFET or in an emitter-down configuration in the case of an IGBT. Further according to this embodiment, the control (gate) terminal 130 of the semiconductor die is located at the bottom side of the die 110 with the source or emitter terminal. The lead frame 102 may include an additional lead (not shown) attached to the control terminal 130 at the bottom side of the power semiconductor die 110. The additional lead of the lead frame 102 may be exposed at the same side of the mold compound 112 as the first lead(s) 108 of the lead frame 102.

In yet another embodiment, the semiconductor die 110 is a lateral power transistor die such as a HEMT (high-electron mobility transistor) die, a driver die for a power transistor die, a controller die, etc. According to this embodiment, all power terminals are disposed at the top side of the power semiconductor die 110 and a thermal connection is provided between the backside of the die 110 and the die pad 106 of the lead frame 102.

The molded semiconductor package 100 can use different interconnect technologies for contacting the semiconductor die 110 and the metal clip 114 of the clip frame 104. Separately or in combination, more than one semiconductor die can be embedded in the mold compound 112, and the clip frame 104 may include more than one metal clip to accommodate the different dies. If more than one terminal is provided at the top side of the semiconductor die 110, the clip frame 104 may be used as the exclusive interconnect for all terminals at the top side of each semiconductor die. Alternatively, the clip frame 104 may be used in conjunction with other interconnect types such as wire bonds, metal ribbons, etc. to form the connections to the terminals at the top side of each semiconductor die, if more than one terminal is provided at the top side of the semiconductor die 110. Separately or in combination, the clip frame 104 may provide one or more interconnections between multiple dies in the case of more than one semiconductor die 110 being included in the same molded semiconductor package 100. For example, the clip frame 104 may provide an interconnection between an IGBT power transistor die and a freewheeling diode die include in the same molded semiconductor package 100. In another example, the clip frame 104 may connect two power transistor dies (e.g. MOSFETs) included in the same molded semiconductor package 100 in a half bridge configuration. One power transistor die may be mounted in a drain-down configuration and the other power transistor die in a source-down configuration. In another case, both power transistor dies may be mounted in the same drain-down or source-down configuration. In each case, the clip frame 104 can be used to connect two or more semiconductor dies included in the same molded semiconductor package 100 at the respective top sides of the dies.

Figure 2:
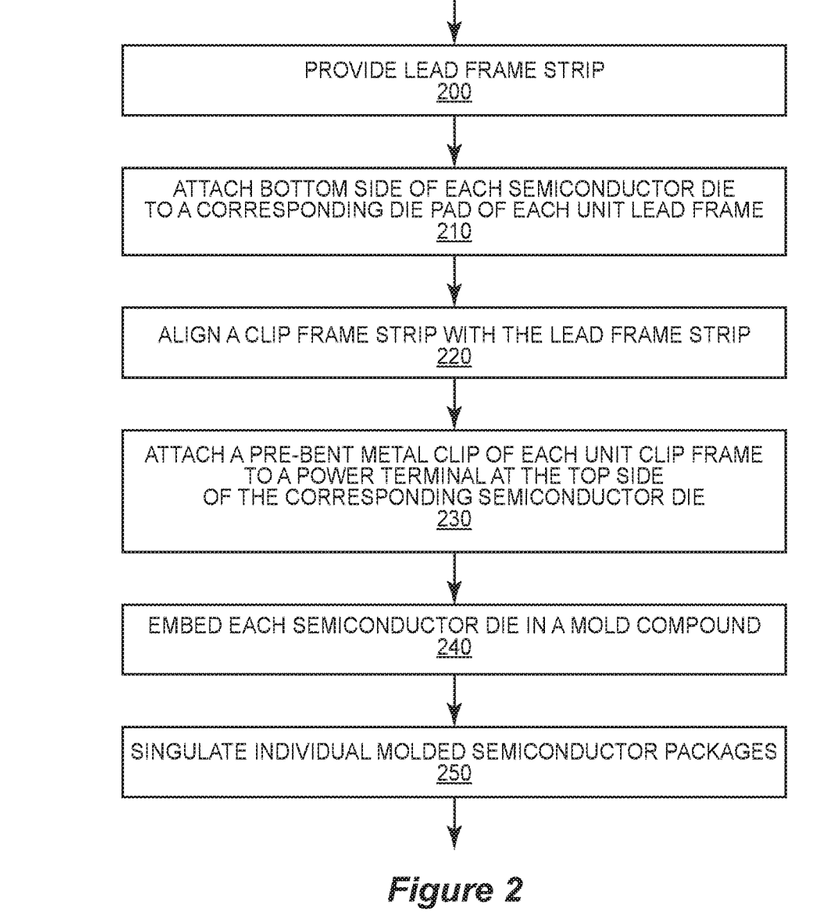
FIG. 2 illustrates an embodiment of a method of manufacturing molded semiconductor packages each having a lead frame to which a semiconductor die is attached and a separate clip frame for contacting one or more terminals at the top side of the semiconductor die.

FIG. 2 illustrates an embodiment of a method of manufacturing molded semiconductor packages each having a lead frame to which a semiconductor die is attached and a separate clip frame for contacting one or more terminals at the top side of the semiconductor die. The method may be used to manufacture the molded semiconductor package 100 illustrated in FIGS. 1A through 10 and described above. FIGS. 3A through 3D illustrate a lead frame panel 300 and a clip frame panel 302 during different stages of the manufacturing method illustrated in FIG. 2, with FIGS. 3A and 3C being enlarged partial views.

The manufacturing method illustrated in FIG. 2 includes providing a lead frame panel 300 which includes a plurality of unit lead frames 304 connected to one another (Block 200). Each unit lead frame 304 includes a die pad 306 and one or more first leads 308 monolithically formed with the die pad 306 and extending outward from the die pad 306 in a first direction x1. The die pad 306 and the one or more first leads 308 are attached to a periphery 310 of the corresponding unit lead frame 304. One or more tie bars 312 may be provided to further secure each respective die pad 306 to the periphery 310 of the corresponding unit lead frame 304. The lead frame panel 300 may be formed from a metal sheet, and the lead frame features described herein may be formed using typical techniques such as stamping, punching, etching, etc. Exemplary materials for the lead frame panel 300 include metals such as copper, aluminum, nickel, iron, zinc, etc., and alloys thereof.

Figure 3A:
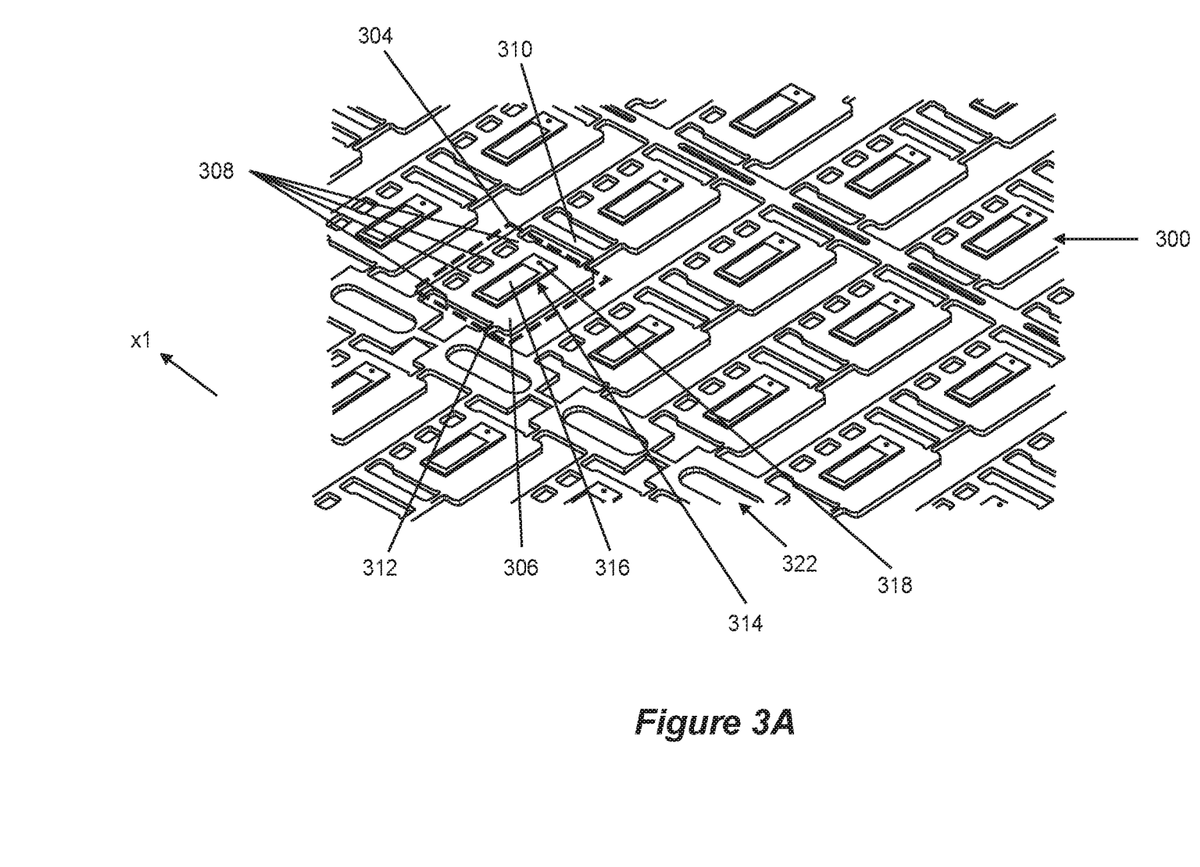
FIGS. 3A through 3D illustrate a lead frame panel and a clip frame panel during different stages of the manufacturing method illustrated in FIG. 2, with FIGS. 3A and 3C being enlarged partial views.

The manufacturing method illustrated in FIG. 2 further includes attaching a separate semiconductor die 314 at the bottom side to each of the die pads 306 of the lead frame panel 300 (Block 210). FIG. 3A shows several lead frame units 304 of the lead frame panel 300 after the die attach process. Each semiconductor die 314 includes a power terminal 316 at the die top side. Depending on the type of semiconductor dies 314, each die 314 may also have a power terminal (out of view) at the die bottom side. The lead frame panel 300 may be unbent, allowing for easy application of a die attach material such as solder paste, sinter paste, glue, etc. to the die pad 306 of each unit lead frame 304. Even if the lead frame panel 300 is unbent, the lead frame panel 300 may still include coined areas, dimples, grooves, etc. The die attach material may be applied to the die pads 306 using a typical process such as a printing process (e.g. stencil, screen printing, etc.), a dispensing process, a jetting process, etc. Each semiconductor die 314 may also include, e.g., in the case of a power transistor die, a control (gate) terminal 318 at the die top side or at the die bottom side.

Figure 3B:
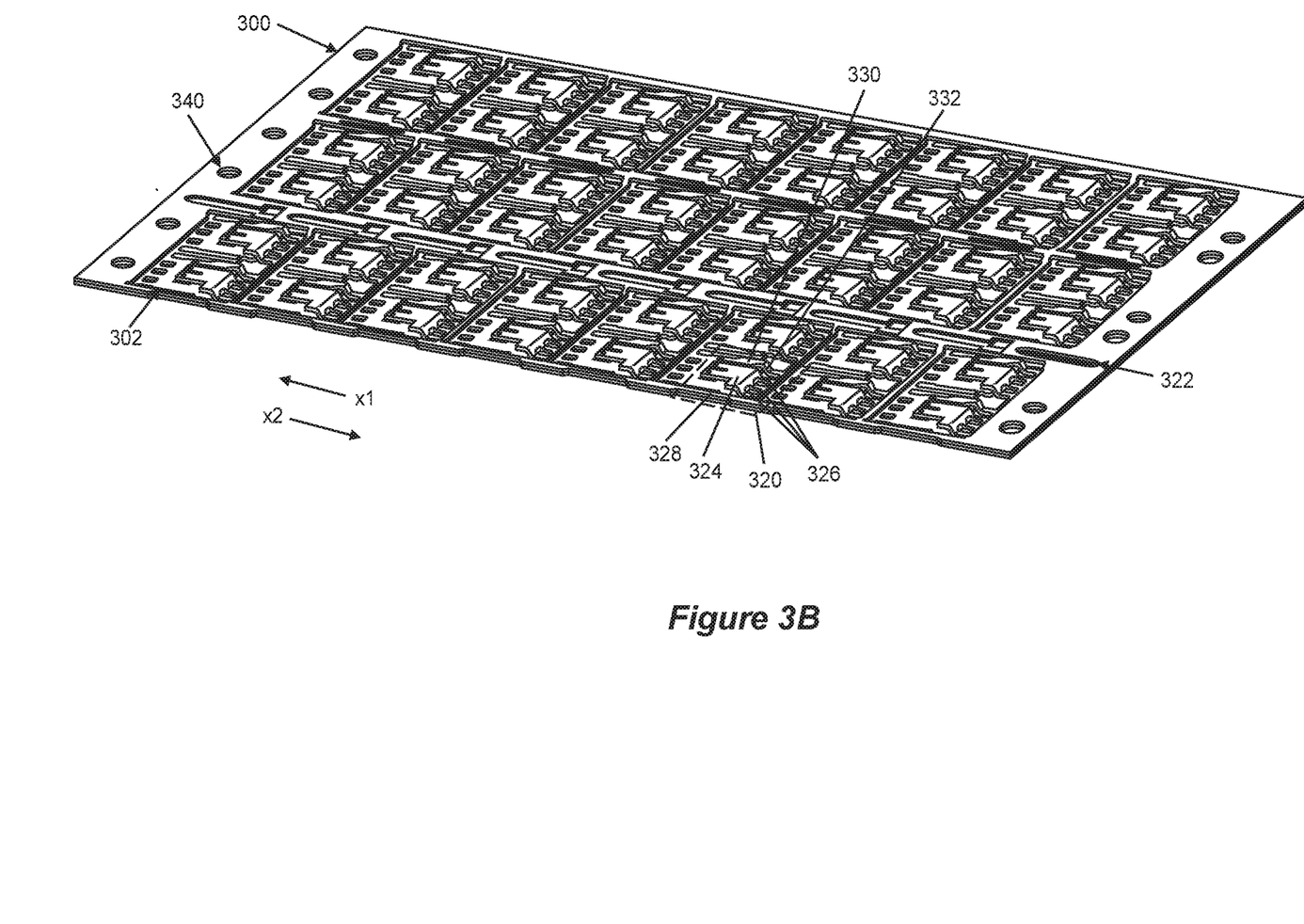
Figure 3C:
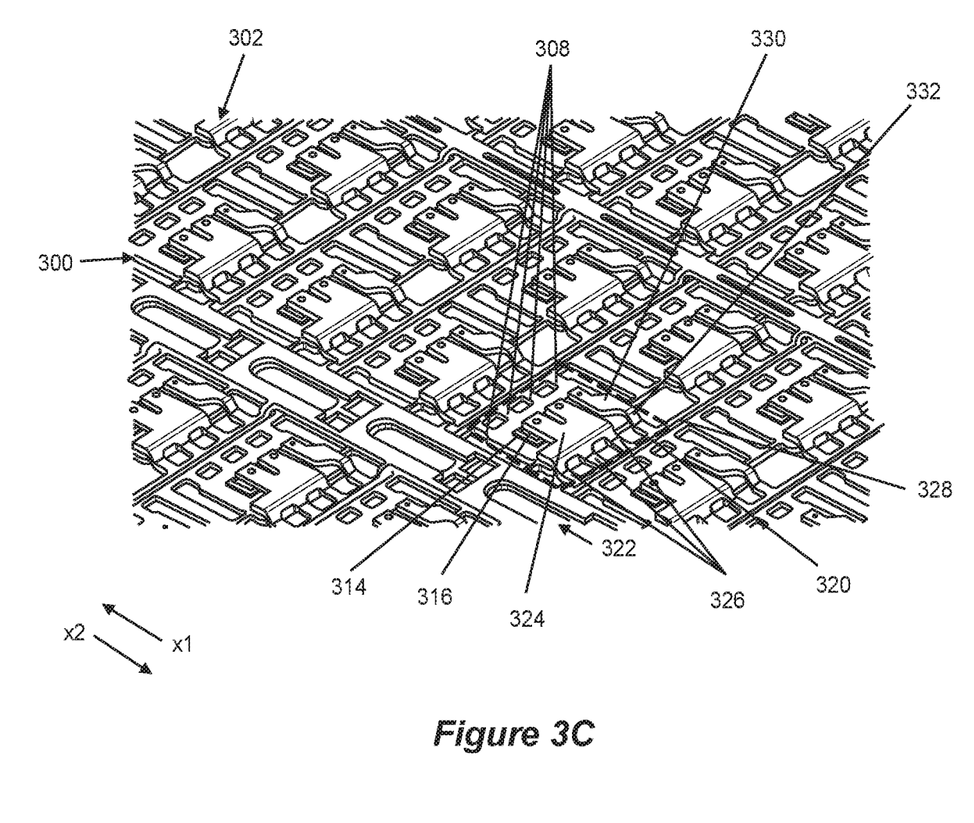

The manufacturing method illustrated in FIG. 2 further includes vertically aligning a clip frame panel 302 with the lead frame panel 300 (Block 220). FIG. 3B shows the clip frame panel 302 vertically aligned with the lead frame panel 300, and FIG. 3C shows an enlarged region of the overlapping structure. The clip frame panel 302 may be pressed against the lead frame panel 300 to provide tight sealing during molding of the semiconductor dies 314. The unit clip frames 304 may be stacked on top of respective unit lead frames 320 of the clip frame panel 302 in an area of a mold runner 322 used during the molding process. In general, the clip frame panel 302 includes a plurality of unit clip frames 320 connected to one another. Each unit clip frame 320 includes a first pre-bent metal clip 324 vertically aligned with the corresponding power terminal 316 at the top side of one of the semiconductor dies 314, and one or more second leads 326 monolithically formed with the first pre-bent metal clip 324. The metal clips 324 are pre-bent before the package assembly process, and the metal clips 324 are formed in such a way that after assembly the clips 324 connect to the front side of the semiconductor dies 314 while each second lead 326 of the unit clip frames 320 is on the same level as each first leads 308 of the unit lead frames 304.

The second lead(s) 326 of each unit clip frame 320 extend outward from the first pre-bent metal clip 324 in a second direction x2 different than the extension direction x1 for the first lead(s) 308 of the corresponding unit lead frame 304, and are attached to a periphery 328 of the unit clip frame 320. The first pre-bent metal clip 324 of the unit clip frames 320 may transition from a first level above the power terminal 316 at the top side of the corresponding semiconductor die 314 to a second level in the same plane as the first lead(s) 308 of the unit lead frames 304 and the second lead(s) 326 of the unit clip frames 320, as previously described herein. For example, the first metal clip 324 of the unit clip frames 320 may be bent in at least two different places to provide the transition from the first level to the second level.

The manufacturing method illustrated in FIG. 2 further includes attaching each first pre-bent metal clip 324 of the unit clip frames 320 to the power terminal 316 at the top side of the corresponding semiconductor die 314 (Block 230). A force/weight may be applied during the clip attach process to achieve the correct height of the unit clip frames 320. The same or different type of die attach material used to attach the semiconductor dies 314 to the die pads 306 of the unit lead frames 304 may be used to attach each first pre-bent metal clip 324 of the unit clip frames 320 to the second power terminal 316 at the top side of the corresponding semiconductor die 314. One or both joints, between the die pads 306 and dies 314 and/or between the metal clips 324 and the top-side power terminal 316 of the dies 314, may be realized by, e.g., diffusion soldering so that no additional application of a joining material is done. Each first pre-bent metal clip 324 of the unit clip frames 320 instead may be attached to the power terminal 316 at the top side of the corresponding semiconductor die 314 before the semiconductor dies 314 are attached to the respective unit lead frames 304. That is, Block 230 in FIG. 2 may be performed before Block 210. In general, a particular sequence of steps is not required unless explicitly stated. In either case, after the chip assembly process, soldering, sintering, etc. of the die attach regions may be finished by, e.g., reflow.

The unit clip frames 320 may each further include a second pre-bent metal clip 330 in the case of the semiconductor dies 314 having a control (gate) terminal 318 at the top side of the dies 314. The second metal clip 330 of the unit clip frames 320 may be pre-bent in the same way as the first metal clip 324 of the unit clip frames 320, so as to transition from the same first level above the power terminal 316 at the top side of the semiconductor dies 314 to the second level in the same plane as the first lead(s) 308 of the unit lead frames 304 and the second lead(s) 326 of the unit clip frames 320. Each unit clip frame 320 may also include an additional lead 332 extending outward from the second pre-bent metal clip 330 and attached to the periphery 328 of the unit clip frame 320.

In the case of the unit clip frames 320 including a second pre-bent clip 330 for contacting the control terminal 318 of the semiconductor dies 314, the manufacturing method may further include attaching the second pre-bent metal clip 330 of each unit clip frame 320 to the control terminal 318 at the top side of the corresponding semiconductor die 314, thereby providing a gate contact by a metal clip 330 instead of a wire bond. As previously described herein, a wire bond connection may be used instead or the control terminal 318 may be disposed at the bottom side of the semiconductor dies 314 instead of the top side, in which case each unit lead frame 304 includes an additional lead (not shown) for contacting the gate terminal 318 at the bottom side of the semiconductor dies 314.

Figure 3D:
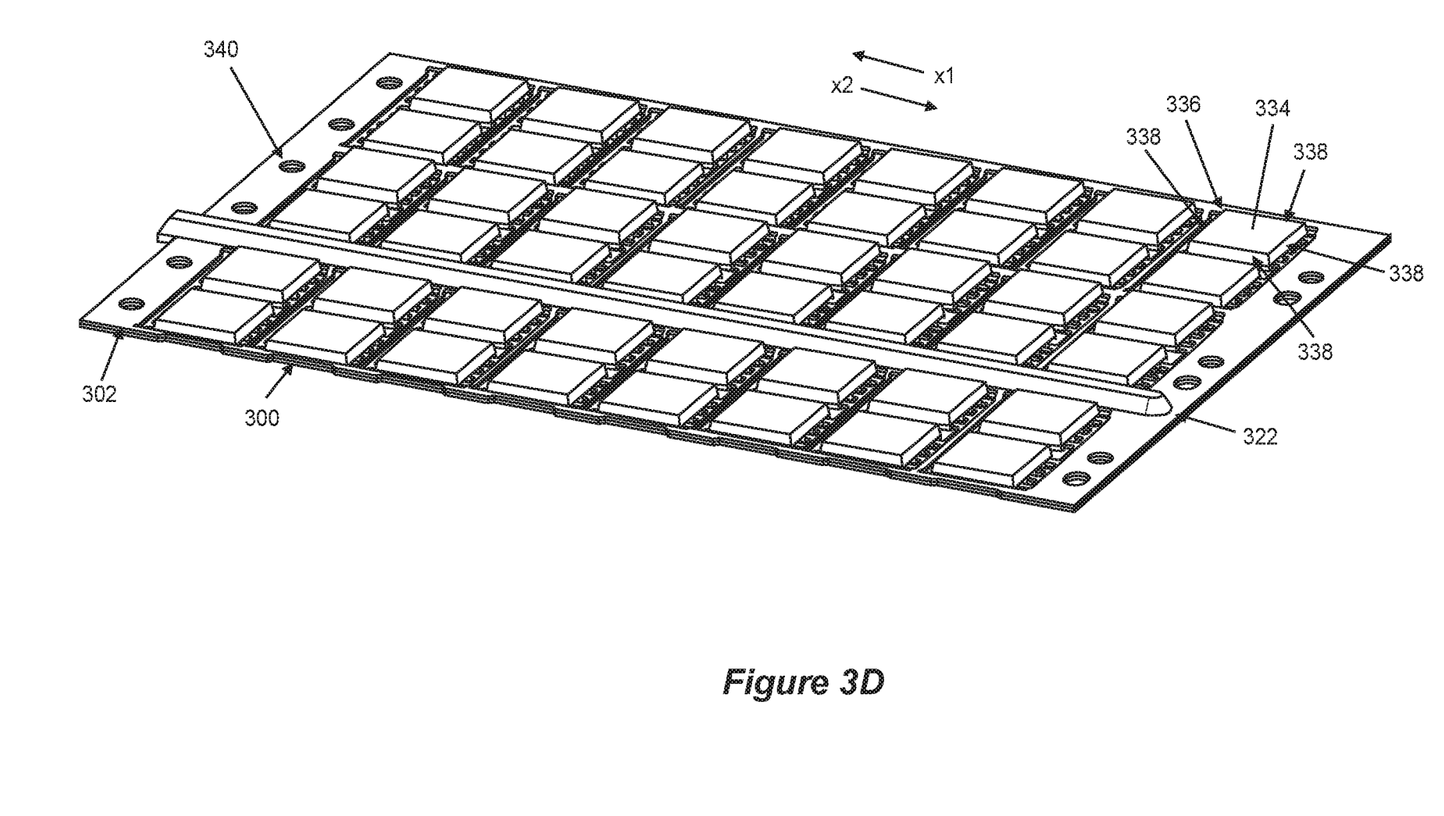

The manufacturing method illustrated in FIG. 2 further includes embedding the semiconductor dies 314 in a mold compound 334 so that each first lead 308 of the unit lead frames 304 and each second lead 326 of the unit clip frames 320 protrude from the mold compound 334 in generally planar directions, e.g. x1 and x2 in FIGS. 3A through 3D, and do not vertically overlap with one another (Block 240). FIG. 3D shows the semiconductor dies 314 embedded in the mold compound 334. The unit clip frames 320 may be pressed against the respective unit lead frames 304 to provide tight sealing during the embedding of the semiconductor dies 314 in the mold compound 334. The unit lead frames 304 may be partially etched or coined from the bottom side, to allow a larger die pad at a given insulation distance and/or to improve locking with the mold compound 334.

For each molded semiconductor package 336, the lead(s) 308 of the unit lead frame 304 and the leads 326, 332 of the clip frame 320 extend in different but not necessarily opposite directions, e.g. x1 and x2 in FIGS. 3A through 3D, and are disposed at different but not necessarily opposite sides of the molded semiconductor package 336. Any typical molding process such as injection molding, compression molding, film-assisted molding (FAM), reaction injection molding (RIM), resin transfer molding (RTM), map molding, blow molding, etc. may be used to embed the semiconductor dies 314 in the mold compound 334. Common mold compounds and resins include, but are not limited to, thermoset resins, gel elastomers, encapsulants, potting compounds, composites, optical grade materials, etc.

The manufacturing method illustrated in FIG. 2 further includes separating each lead 308 from the periphery 310 of the corresponding unit lead frame 304 and each lead 326, 332 from the periphery 328 of the corresponding unit clip frame 320 outside the mold compound 334 (Block 250). In one embodiment, each lead 308 of the unit lead frames 304 is separated from the periphery 310 of the corresponding unit lead frame 304 and each lead 326, 332 of the unit clip frames 320 is separated from the periphery 328 of the corresponding unit clip frame 320 outside the mold compound 334 by stamping the leads 308, 326, 332 outside the mold compound 334. In another embodiment, each lead 308 of the unit lead frames 304 is separated from the periphery 310 of the corresponding unit lead frame 304 and each lead 326, 332 of the unit clip frames 320 is separated from the periphery 328 of the corresponding unit clip frame 320 outside the mold compound 334 by cutting the leads 308, 326, 332 outside the mold compound 334.

Since the leads 308, 326, 332 lay open and are free from the mold compound 334, lead cutting is simpler and no (metal) smearing effects should occur, particularly since the leads 326, 332 of the clip frames 320 do not vertically overlap with the lead(s) 308 of the lead frames 304. The overall complexity of the manufacturing process also is reduced, by using only a single clip frame panel 302 which eases the assembly process because independent of whether a human or a machine provides the frames 300, 302 on top of each other, there is only a single action needed instead of attaching several metal clips (or rows of metal clips) to a single lead frame panel. Furthermore, the use of a single clip frame panel 302 also eliminates clip tilt/rotation issues in comparison with attaching several metal clips (or rows of metal clips) to a single lead frame panel since all of the unit clip frames 320 are secured to the same clip frame panel 302.

In the case of each unit clip frame 320 including a second pre-bent clip 330 for contacting a control terminal 316 at the top side of the corresponding semiconductor die 314, the manufacturing method may further include separating the lead 332 monolithically formed with the second pre-bent metal clip 330 from the periphery 328 of the corresponding unit clip frame 320 outside the mold compound 334 via the same singulation process such as stamping or cutting used to separate each lead 308 from the periphery 310 of the corresponding unit lead frame 304 and each lead 326, 332 from the periphery 328 of the corresponding unit clip frame 320. For some types of packages, part of each lead 308 of the unit lead frame 304 and part of each lead 326, 332 of the unit clip frame 320 of each molded package 336 may not be covered by the mold compound 334. The uncovered part of the leads 308, 326, 332 may be flush, recessed, or protrude slightly from the mold compound 334. For some types of packages, each lead 308 of the unit lead frame 304 and each lead 326, 332 of the unit clip frame 320 of each molded package 336 may protrude outward from different but not necessarily opposite side faces 338 of the mold compound 334.

The manufacturing method may also include galvanic or electroless plating the part of each lead 308 of the unit lead frames 304 and the part of each lead 326, 332 of the unit clip frames 320 which protrude from different side faces 338 of the mold compound 334, to form wettable lead surfaces at different side faces 338 of the mold compound 334 of each molded semiconductor package 336, allowing for an easier inspection of subsequent solder connections between the leads 308, 326, 332 of the molded semiconductor package 336 to a board since wetting/solder joints are readily visible.

The assembly shown in FIGS. 3A through 3D may instead be manufactured upside down, with the clip attach process (Block 230) being performed before the die attach process (Block 210), and/or a printing process such as stencil or screen printing may be used separately on the lead frame panel 300 and clip frame panel 302. In the case of power transistor dies, the semiconductor dies 314 may instead be placed source-down (or emitter-down) and each unit lead frame 304 may provide the source and gate contacts whereas the metal clip 334 of the corresponding unit clip frame 320 forms a single pad only for the drain. Each unit clip frame panel 302 and/or lead frame panel 300 may have alignment features 340 such as dimples, holes, etc. to aid in the aligning of the clip frame panel 302 with the respective lead frame panel 300. For example, an optical alignment process or a pin alignment process may be used to align the clip frame panel 302 with the lead frame panel 300.

Figure 4A:
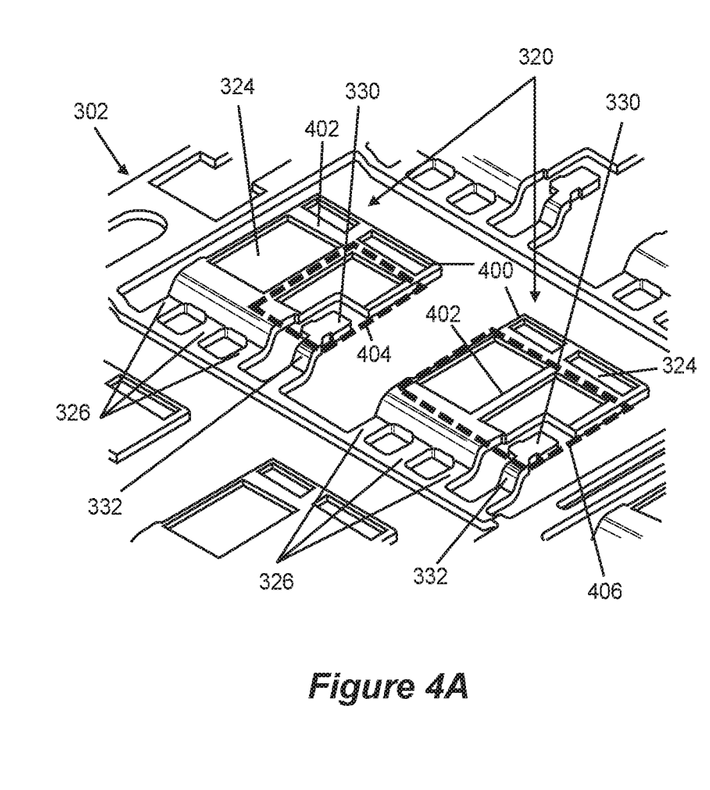
FIGS. 4A and 4B illustrate respective partial views of the clip frame panel, according to further embodiments.
Figure 4B:
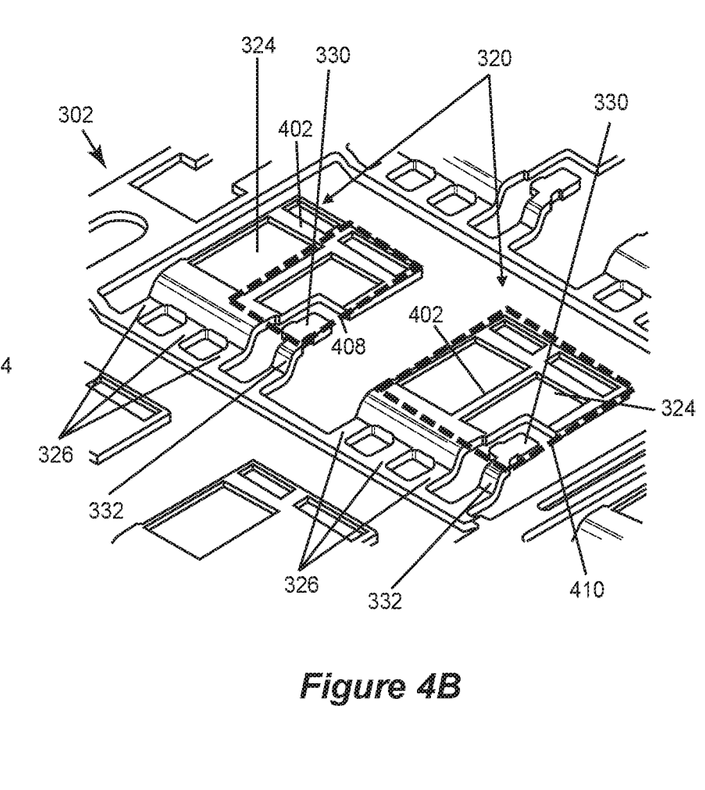

FIGS. 4A and 4B illustrate respective partial views of the clip frame panel 302, according to further embodiments. There may be crossings between the unit clip frames 320 and the respective unit lead frames 304.

To reduce insulation distance and avoid shorts, the edge of the first metal clips 324 may include wave-like features 400 which extend upward in a wave-like manner at the edge of the respective semiconductor chips 314. To accommodate more than one die size per clip 324, additional wave-like features 402 may be added inward from the clip edge. For example, each first metal clip 324 may have two intersecting (transverse) wave-like features 402 so as to accommodate four different chip sizes. The regions labelled 404, 406 in FIG. 4A and the regions labelled 408, 410 in FIG. 4B indicate different chip size areas which can be accommodated by the same first metal clip 324 by providing the wave-like features 400, 402. The wave-like features 400, 402 may also be formed as slots or as a coined bottom side or some combination of both. Features such as dimples, slots, crosses, etc. may be applied to the first metal clips 324, e.g., to mitigate against die tilting/rotation and/or to improve mold locking.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a molded semiconductor package, the method comprising:
 providing a lead frame comprising a die pad and one or more first leads monolithically formed with the die pad and extending outward from the die pad in a first direction, the die pad and the one or more first leads being attached to a periphery of the lead frame;
 attaching a first side of a semiconductor die to the die pad;
 aligning a clip frame with the lead frame so that a first pre-bent metal clip of the clip frame is vertically aligned with a power terminal at a second side of the semiconductor die opposite the first side, the clip frame further comprising one or more second leads monolithically formed with the first pre-bent metal clip and extending outward from the first pre-bent metal clip in a second direction different than the first direction and attached to a periphery of the clip frame;
 attaching the first pre-bent metal clip to the power terminal at the second side of the semiconductor die;
 embedding the semiconductor die in a mold compound so that the one or more first leads and the one or more second leads protrude from the mold compound in generally planar directions and do not vertically overlap with one another; and
 separating the one or more first leads from the periphery of the lead frame and the one or more second leads from the periphery of the clip frame outside the mold compound.

2. The method of claim 1, wherein separating the one or more first leads from the periphery of the lead frame and the one or more second leads from the periphery of the clip frame outside the mold compound comprises:
 stamping the one or more first leads and the one or more second leads outside the mold compound.

3. The method of claim 1, wherein separating the one or more first leads from the periphery of the lead frame and the one or more second leads from the periphery of the clip frame outside the mold compound comprises:
 cutting the one or more first leads and the one or more second leads outside the mold compound.

4. The method of claim 1, further comprising:
 attaching a second pre-bent metal clip of the clip frame to a control terminal at the second side of the semiconductor die,
 wherein the clip frame further comprises a third lead extending outward from the second pre-bent metal clip and attached to the periphery of the clip frame,
 wherein after embedding the semiconductor die in the mold compound, the third lead protrudes from the mold and does not vertically overlap with the one or more first leads.

5. The method of claim 4, further comprising:
 separating the third lead from the periphery of the clip frame outside the mold compound via a same stamping process used to separate the one or more first leads from the periphery of the lead frame and the one or more second leads from the periphery of the clip frame.

6. The method of claim 1, wherein the one or more first leads protrudes from a first side face of the mold compound after separation from the periphery of the lead frame, and wherein the one or more second leads protrudes from a second side face of the mold compound different than the first side face after separation from the periphery of the clip frame.

7. The method of claim 6, further comprising:
 plating the part of the one or more first leads which protrudes from the first side face of the mold compound and the part of the one or more second leads which protrudes from the second side face of the mold compound, to form wettable lead surfaces at different side faces of the mold compound.

8. The method of claim 1, wherein the lead frame is unbent.

9. The method of claim 1, wherein the clip frame comprises alignment features to aid in the aligning of the clip frame with the lead frame.

10. The method of claim 1, wherein the clip frame is stacked on top of the lead frame in an area of a mold runner used during the embedding of the semiconductor die in the mold compound.

11. The method of claim 1, further comprising:
 pressing the clip frame against the lead frame to provide tight sealing during the embedding of the semiconductor die in the mold compound.

12. A method of manufacturing molded semiconductor packages, the method comprising:
 providing a lead frame panel which includes a plurality of unit lead frames connected to one another, each unit lead frame comprising a die pad and one or more first leads monolithically formed with the die pad and extending outward from the die pad in a first direction, the die pad and the one or more first leads being attached to a periphery of the unit lead frame;
 attaching a separate semiconductor die at a first side to each of the die pads, each semiconductor die comprising a power terminal at a second side opposite the first side;
 aligning a clip frame panel with the lead frame panel, the clip frame panel including a plurality of unit clip frames connected to one another, each unit clip frame comprising a first pre-bent metal clip vertically aligned with a corresponding power terminal at the second side of one of the semiconductor dies, and one or more second leads monolithically formed with the first pre-bent metal clip and extending outward from the first pre-bent metal clip in a second direction different than the first direction and attached to a periphery of the unit clip frame;
 attaching each first pre-bent metal clip to the power terminal at the second side of the corresponding semiconductor die;
 embedding the semiconductor dies in a mold compound so that each one or more first leads and each one or more second leads protrude from the mold compound in generally planar directions and do not vertically overlap with one another; and
 separating each one or more first leads from the periphery of the corresponding unit lead frame and each one or more second leads from the periphery of the corresponding unit clip frame outside the mold compound.

* * * * *